United States Patent [19]

Seelbach et al.

[11] Patent Number: 4,785,259
[45] Date of Patent: Nov. 15, 1988

[54] BIMOS MEMORY SENSE AMPLIFIER SYSTEM

[75] Inventors: Walter C. Seelbach, Fountain Hills, Ariz.; Kevin L. McLaughlin, Eau Claire, Wis.; Danny J. Molezion, Norcross, Ga.

[73] Assignee: Motorola, Inc., Schaumburg, Ill.

[21] Appl. No.: 150,607

[22] Filed: Feb. 1, 1988

[51] Int. Cl.$^4$ .......................... H03F 3/16; H03F 3/45
[52] U.S. Cl. ...................................... 330/300; 330/253
[58] Field of Search .............. 330/252, 253, 259, 277, 330/300, 51; 365/189, 207, 177

[56] References Cited

U.S. PATENT DOCUMENTS 4,027,176  5/1977  Heuber et al. ................. 365/208 X
4,577,162  3/1986  Peterson ........................... 330/253
4,713,797  12/1987  Morton et al. ................. 330/257 X Primary Examiner—Eugene R. LaRoche
Assistant Examiner—Steven J. Mottola
Attorney, Agent, or Firm—William E. Koch

[57] ABSTRACT

A BIMOS amplifier having feedback clamping the amplifier's input to a predetermined voltage, minimizes input signal voltage excursions in the presence of large load capacitances. A pair of differentially coupled NPN transistors in response to first and second inputs drive a pair of emitter follower NPN transistors. First and second MOS transistors responsive to first and second enable signals are coupled between the ouput from each of the emitters of the emitter follower transistors and the first and second inputs, respectively.

16 Claims, 3 Drawing Sheets

BIMOS MEMORY SENSE AMPLIFIER SYSTEM

FIELD OF THE INVENTION

This invention relates in general to a feedback amplifier circuit having high open loop gain and low input impedance and, more particularly, to a BIMOS transimpedance amplifier having feedback clamping the amplifier's input to a predetermined voltage, thereby minimizing input signal voltage excursions in the presence of large capacitances, resulting in a faster response to the input signal.

BACKGROUND OF THE INVENTION

Amplifier uses are perverse in the electronics industry. One such use is sense amplifiers in memory arrays. Memory cells are circuits wherein information may be stored in a low current stand-by mode and may be written or read in a higher current mode. A predetermined number of cells are located in rows between each of a plurality of upper and lower word lines and another predetermined number of cells are located in columns between a plurality of bit lines. In other words, each cell is uniquely coupled between a combination of word lines and bit lines.

A row of cells is selected when a high voltage is supplied to the appropriate word line. A particular cell in that row is read by a sense amplifier coupled to the bit lines. A first read current through one bit line flows directly to the sense amplifier. A second read current through the other bit line flows through one side of the memory cell. When a cell is written, the first write current is directed into one side of the cell and the second write current is directed out of the cell.

In most memory arrays using NMOS or CMOS memory cells, sensing data quickly becomes difficult due to the large capacitance associated with the common bit line nodes. To achieve fast sensing, this capacitance must be charged or discharged quickly to produce a voltage differential large enough at the common bit lines, or the gain of the sense amplifier must be high enough, to sense small voltage changes at the common bit line nodes.

Techniques commonly used to achieve sufficient speed for sensing include multiple block memory arrays which reduce the common bit line capacitance and multiple stage sense amplifiers which increases the overall gain of the sense amplifier circuit. However, the multiple block memory arrays provides increased area on chip and circuit complexity, and multiple stage sense amplifiers create longer read access delays.

Thus, what is needed is a transimpedance amplifier having high open loop gain, low input impedance and an input clamped by feedback that minimizes input signal voltage excursions in the presence of large capacitances.

SUMMARY OF THE INVENTION

Accordingly, it is an object of the present invention to provide an improved amplifier circuit.

Another object of the present invention is to provide an amplifier circuit having high open loop gain and low input impedance.

Still another object of the present invention is to provide an amplifier circuit having an input voltage clamped by feedback, thereby preventing charging or discharging of the associated input capacitance.

Yet another object of the present invention is to provide a sense amplifier for a memory array having fast read access and recovery times.

In carrying out the above and other objects of the invention in one form, there is provided first and second differentially coupled transistors coupled for differentially providing first and second signals in response to first and second input signals. First and second emitter follower transistors are coupled between a first output terminal and the first differentially coupled transistor, and a second output terminal and the second differentially coupled transistor, respectively, for providing first and second outputs, respectively, in response to the first and second signals. First and second MOS transistors are coupled between the first output and first input, and the second output and second input, respectively, for selectively clamping the input signals.

The above and other objects, features, and advantages of the present invention will be better understood from the following detailed description taken in conjunction with the accompanying drawings.

DETAILED DESCRIPTION OF THE INVENTION

Figure 1:
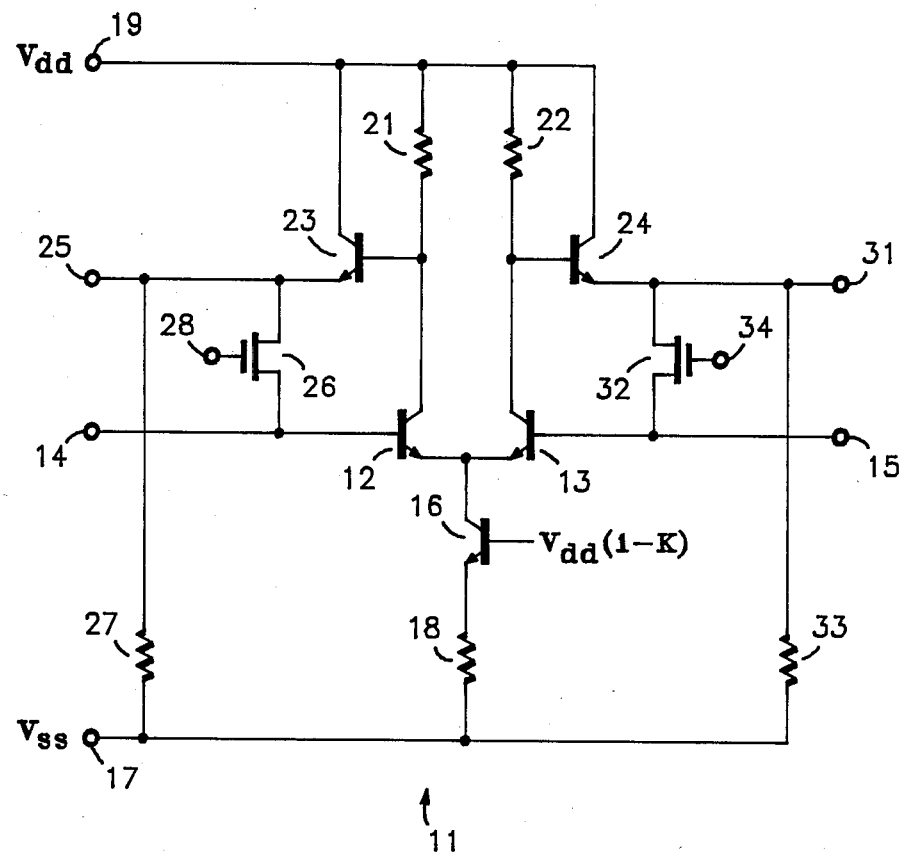
FIG. 1 is a schematic of a first embodiment of the present invention.

Referring to FIG. 1, transimpedance amplifier 11 comprises differentially connected NPN transistors 12 and 13 having their bases connected to input terminals 14 and 15, respectively, and their emitters coupled to the collector of current source transistor 16. The collectors of transistors 12 and 13 are coupled to voltage terminal 19 by resistors 21 and 22, respectively, and to the bases of transistors 23 and 24, respectively. Transistor 16 has a base coupled to receive current source voltage $V_{dd}(1-K)$ and an emitter coupled to voltage terminal 17 by resistor 18. The voltages on terminals 19 and 17 are typically referred to as $V_{dd}$ and $V_{ss}$, respectively, and $V_{ss}$ may be ground. Transistor 23 has a collector connected to terminal 19 and an emitter connected to output terminal 25 and to the drain of transistor 26, and coupled to terminal 17 by resistor 27. Transistor 26 has a gate connected to terminal 28 for receiving read signal R and a source connected to the base of transistor 12. Transistor 24 has a collector connected to terminal 19 and an emitter connected to output terminal 31 and to the drain of transistor 32, and coupled to terminal 17 by resistor 33. Resistors 27 and 33 alternatively may be MOS transistors that provide an active resistance. Transistor 32 has a gate connected to terminal 34 for receiving read signal R and a source connected to the base of transistor 13.

The differential open loop gain of amplifier 11 is determined by the value of resistor 21 and the current sourced through resistor 18 as reflected by the equation as follows:

$$A = \frac{R_{21}(I_{18})}{2(kT/q)}$$

where A=differential open loop gain,
$R_{21}$=resistance of resistor 21 or 22,
$I_{18}$=current through resistor 18, k = Boltzmann's constant,
T = absolute temperature, and
q = electronic charge.

Figure 2:
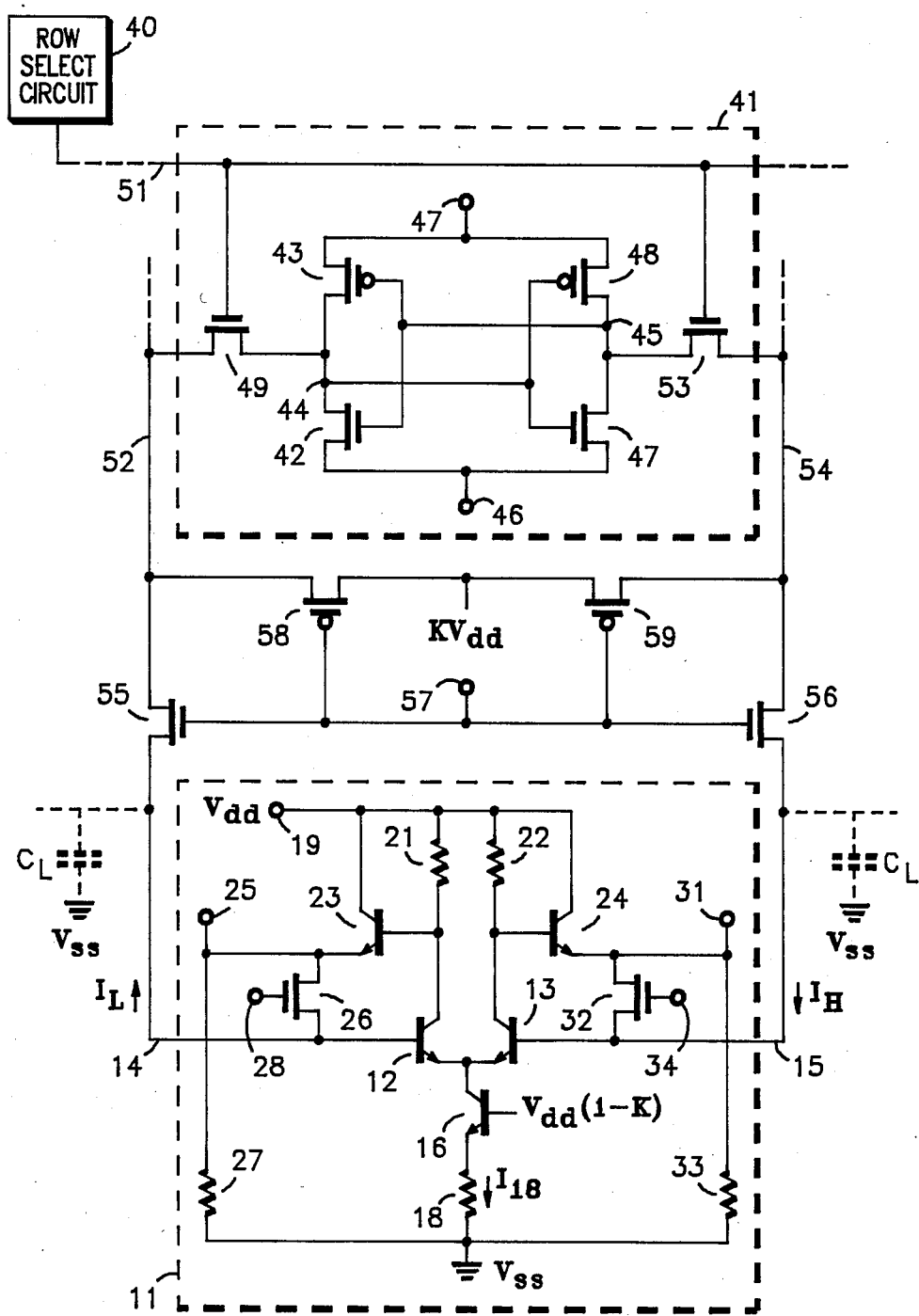
FIG. 2 is a schematic of the first embodiment coupled within a memory array.

The closed differential loop gain of amplifier 11 is determined by the value of the feedback and source resistances, assuming the input base current is negligible (beta >> 1), and is reflected by the equation as follows:

$$G = -R_f/R_{14}$$

where G = closed loop gain,
$R_f$ = "on" resistance of transistor 26 or 32 (feedback resistance), and
$R_{14}$ = the signal source resistance (source resistance is the sum of the on resistances of resistors 49 and 55 of FIG. 2, where $R_{49}$ or $52 >> R_{55 \text{ or } 56}$).
Transistors 26 and 49, and 32 and 53 are of the same polarity (NMOS in this embodiment, but may be PMOS); therefore, the differential input impedance will then track with input resistance $R_{14}$ or $R_{15}$.

The differential input impedance of amplifier 11 is determined by the feedback resistance and open loop gain as reflected by the equation as follows:

$$Z = 2R_f/(1+A)$$

where Z = differential input impedance.

The output voltage of the amplifier is desired to be at an ECL compatible level. Therefore, the magnitude of the closed loop differential voltage gain G will be set at approximately 0.1 if the differential voltage on the input circuitry is $V_{DD}$, i.e., 5.0 volts. This sets the resistance of transistor 26 and 32 in the "on" state to be small relative to differential driving source resistance $R_{14}$ and $R_{15}$. A low value of feedback resistance with a large open loop gain results in a very low input impedance. This low input impedance provides a voltage clamp at the input terminals of the amplifier.

FIG. 2 illustrates amplifier 11 coupled to an array of memory cells 41. The array of memory cells 41 comprises a plurality of cells arranged in rows and columns represented by the dotted lines in word line 51 and bit lines 52 and 54, although only one memory cell 41 is shown. Sense amplifier 11 is coupled to a plurality of columns of memory cells 41. Sense amplifier 11 may be coupled to a larger number of memory cells 41 than previously known sense amplifiers. However, multiple sense amplifiers 11 may be desired for larger memory arrays. Memory cell 41 is illustrated as a conventional cell known in the industry. The invention described herein would work equally well with other types of memory cells. Memory cell 41 comprises transistors 42 and 43 having their drains connected to node 44, their gates connected to node 45, and their sources connected to voltage terminals 46 and 47, respectively. Transistors 47 and 48 have their drains connected to node 45, their gates connected to node 44 and their sources connected to terminals 46 and 47, respectively. Transistor 49 has a drain connected to node 44, a gate coupled to word line 51, and a source connected to bit line 52. Transistor 53 has a source connected to node 45, a gate connected to word line 51, and a drain connected to bit line 54. Row select circuit 40 is coupled to each of word lines 51 for selecting one of word lines 51 in response to a plurality of input signals. Column select transistors 55 and 56 are coupled in bit lines 52 and 54, respectively, between memory cell 41 and amplifier 11 and are responsive to a column select signal applied at terminal 57.

When the voltage differential between nodes 14 and 15 is zero, the current sourced through resistor 18, as determined by $V_{dd}(1-K)$, transistor 16, and resistor 18, will split evenly through transistors 12 and 13. Therefore, the voltage across load resistors 21 and 22 will be $V_{21}$ or $V_{22} = (R_{21})(I_{18}/2)$. With current $I_{18}$ set such that the voltage across load resistors 21 or 22 is equal to voltage $KV_{dd}$ minus a base-emitter voltage, then the voltage on terminals 25 and 31 (output at emitters of transistors 23 and 24, respectively) will be clamped to a level equal to $KV_{DD}$ where $0.5 + (\phi_E)/2V_{DD} < K < (V_{GS} - V_{TN})/V_{DD}$, where $V_{GS}$ and $V_{TN}$ are the gate to source voltage and threshold voltage of transistor 32, respectively. With very little voltage drop across feedback transistors 26 and 32, the voltages at nodes 14 and 15 are also clamped to $KV_{DD}$. Thus, the value of K, which may be designed to compensate for chip temperature variations, is set by an external bias network and allows for the control of the voltages at nodes 14 and 15 according to the requirements of memory cell 41.

The value of K, set by an external bias network not illustrated, allows the common bit line nodes to be set to a level designed to meet the needs of the memory cell. For example, if an electrically balanced six transistor cell were used, the value of K could be $0.5 + (\phi_E)/2V_{DD}$, clamping the common bit line nodes to $V_{dd}(1-K)$. This level would lead to a fast read without cell disturbance. Obviously, if the width of the P-channels in the memory cells are reduced or if poly load resistors are used, then the value of K would be designed larger than $0.5 + (\phi_E)/2V_{DD}$ so the common bit lines would be clamped at a voltage level closer to $V_{DD}$.

When a memory cell is decoded by applying the appropriate signal at terminal 57 and word line 51, thereby turning on transistors 55 and 56 and transistors 49 and 53, the stored voltages at nodes 44 and 45 act as voltage sources generating current that flows into and out of memory cell 41. For example, current $I_H$ would flow from the memory cell at node 45 to input node 15, and current $I_L$ would flow from input node 14 to the memory cell at node 44. The voltage at node 45 sees the "on" resistances of transistors 53 and 56 and the input impedance Z of amplifier 11. The resistance of transistor 56 is negligible compared to transistor 53 and the input impedance Z is very low. The low input impedance clamps nodes 14 and 15 resulting in very little voltage change at node 15. With a small change in voltage at node 15, only a negligible amount of current $I_H$ flows into the load capacitance. This eliminates the time heretofor wasted in charging and discharging the large capacitance $C_L$ normally associated with the common bit line nodes.

Most of current $I_H$ will flow into the low impedance path of amplifier 11. This current, essentially $I_H$, multiplied by low input impedance Z will produce a small voltage which, when magnified by gain A, generates an increase in the output voltage across resistor 22.

For the other side of amplifier 11, a small current from node 14 reduces the voltage drop across resistor 21. The resulting differential voltage across resistors 21 and 22, level shifted a base-emitter voltage by transistors 23 and 24, is the output of the amplifier at terminals 25 and 31. The transimpedance of amplifier 11 is the output voltage change divided by the input current change.

Column select response time is improved by coupling transistors 58 and 59 between bit lines 52 and 54, respectively, and voltage $KV_{dd}$. The gates of transistors 58 and 59 are connected to terminal 57 for receiving an inverse column select signal. Thus, when the column is not selected, bit lines 52 and 54 will be at voltage $KV_{DD}$ minimizing noise on the common bit lines during the read mode when a previously unselected column is selected.

Figure 3:
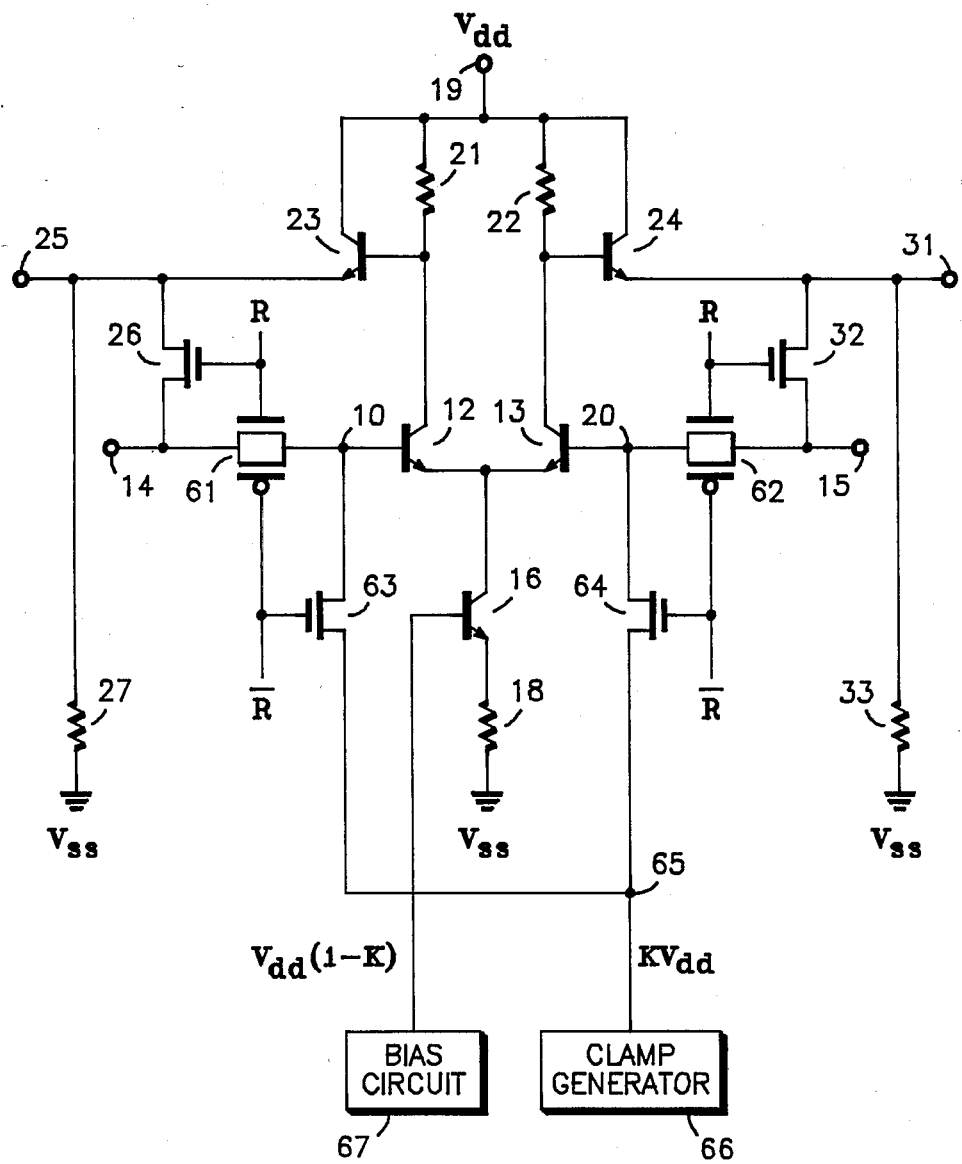
FIG. 3 is a partial block diagram of a second embodiment of the present invention.

FIG. 3 illustrates a second embodiment of amplifier 11 for sensing the state of memory cell 41. Elements found in amplifier 11 of FIG. 1 are numbered identically for ease of description. Additional elements found in the embodiment of FIG. 3 include transmission gates 61 and 62 coupled between node 10 and terminal 14, and node 20 and terminal 15, respectively, and having their gates coupled for receiving read signal R and its complement R BAR to prevent the bases of transistors 12 and 13 from being driven by the write drivers during a write cycle. Transistors 63 and 64 have drains coupled to nodes 10 and 20, respectively, gates coupled to receive read signal R BAR, and sources connected to node 65 for clamping the bases of transistors 12 and 13 to the output of clamp circuit 66 during a write cycle. Bias circuit 67 is coupled to the base of transistor 16 for biasing the base of transistor at $V_{dd}(1-K)$ in order that the voltage at terminals 14 and 15 will be $K_{Vdd}$.

By now it should be appreciated that there has been provided a BIMOS transimpedance amplifier having feedback clamping the amplifier's input, thereby preventing the large associated capacitance from being charged or discharged, resulting in a faster response to the input signal.

We claim:

1. A circuit comprising:
a first supply voltage terminal;
a second supply voltage terminal;
a first input terminal;
a second input terminal;
a first enable terminal;
a second enable terminal;
a first output terminal;
a second output terminal;
first means coupled between said first and second supply voltage terminals and coupled to said first and second input terminals for differentially providing first and second signals;
second means coupled between said first supply voltage terminal and said first output terminal and coupled to said first means and responsive to said first signal for providing a first output;
third means coupled between said first supply voltage terminal and said second output terminal and coupled to said first means and responsive to said second signal for providing a second output;
fourth means coupled between said first output terminal and said first input terminal and coupled to said first enable terminal for selectively clamping said input terminal; and
fifth means coupled between said second output terminal and said second input terminal and coupled to said second enable terminal for selectively clamping said input terminal.

2. The circuit according to claim 1 wherein said first means comprises:
a first resistor;
a second resistor;
a current source;
a first transistor having a collector coupled to said first supply voltage terminal by said first resistor and to said second means, a base coupled to said first input terminal, and an emitter coupled to said second supply voltage terminal by said current source; and
a second transistor having a collector coupled to said first supply voltage terminal by said second resistor and to said third means, a base coupled to said second input terminal, and an emitter coupled to said second supply voltage terminal by said current source.

3. The circuit according to claim 2 wherein said second means comprises a third transistor having a collector coupled to said first supply voltage terminal, a base coupled to said collector of said first transistor, and an emitter coupled to said first output terminal and said fourth means.

4. The circuit according to claim 3 wherein said fourth means comprises a fourth transistor having a drain coupled to said emitter of said third transistor, a gate coupled to said first enable terminal, and a source coupled to said base of said first transistor.

5. The circuit according to claim 3 wherein said third means comprises a fourth transistor having a collector coupled to said first supply voltage terminal, a base coupled to said collector of said second transistor, and an emitter coupled to said second output terminal and said fifth means.

6. The circuit according to claim 5 wherein said fifth means comprises a fifth transistor having a drain coupled to said emitter of said fourth transistor, a gate coupled to said second enable terminal, and a source coupled to said base of said second transistor.

7. The circuit according to claim 6 wherein said fourth means comprises a sixth transistor having a drain coupled to said emitter of said third transistor, a gate coupled to said first enable terminal, and a source coupled to said base of said first transistor.

8. A memory circuit comprising:
a plurality of word lines;
a plurality of pairs of bit lines;
a plurality of memory cells, wherein each of said memory cells are uniquely coupled between one of said pair of bit lines and to one of said plurality of word lines, each of said memory cells having a read mode and a write mode;
first means coupled to said plurality of word lines for selecting one of said word lines;
second means coupled to said plurality of pairs of bit lines for selecting one of said pair of bit lines; and
a plurality of third means, each of said third means coupled to a pair of bit lines for sensing the voltage on said pair of bit lines for determining the mode of said memory cell uniquely coupled thereto, each of said third means comprising:
a first output terminal;
a second output terminal;
fourth means coupled to said pair of bit lines for differentially providing first and second signals;
fifth means coupled between said first means and said first output terminal and responsive to said first signal for providing a first output;
sixth means coupled between said first means and said second output terminal and responsive to said second signal for providing a second output;
seventh means coupled between one of said bit lines and said first output terminal for selectively clamping a voltage on said bit line during said read mode; and eighth means coupled between said another of said bit lines and said second output terminal for selectively clamping a voltage on said bit line during said read mode.

9. The circuit according to claim 8 further comprising ninth means coupled between said pair of bit lines for clamping said bit lines at a clamping voltage when said bit lines are not selected.

10. The circuit according to claim 9 wherein said ninth means comprises:
   a voltage terminal for receiving said clamping voltage;
   a first transistor coupled between one of said bit lines and said voltage terminal and having a gate coupled to said second means and responsive to a column select signal; and
   a second transistor coupled between the other of said bit lines and said voltage terminal and having a gate coupled to said second means and responsive to said column select signal.

11. The circuit according to claim 8 wherein said fourth means comprises:
   a first resistor;
   a second resistor;
   a current source;
   a first transistor having a collector coupled to a first voltage by said first resistor and to said fifth means, a base coupled to one of said bit lines, and an emitter coupled to a second voltage by said current source; and
   a second transistor having a collector coupled to said first voltage by said second resistor and to said sixth means, a base coupled to another of said bit lines, and an emitter coupled to said second voltage terminal by said current source.

12. The circuit according to claim 11 wherein said fifth means comprises a third transistor having a collector coupled to said first voltage, a base coupled to said collector of said first transistor, and an emitter coupled to said first output terminal and said sixth means.

13. The circuit according to claim 12 wherein said seventh means comprises a fourth transistor having a drain coupled to said emitter of said third transistor, a gate coupled to receive a first enable signal, and a source coupled to said base of said first transistor.

14. The circuit according to claim 12 wherein said sixth means comprises a fourth transistor having a collector coupled to said first voltage, a base coupled to said collector of said second transistor, and an emitter coupled to said second output terminal and said fifth means.

15. The circuit according to claim 14 wherein said eighth means comprises a fifth transistor having a source coupled to said emitter of said fourth transistor, a gate coupled to receive a second enable signal, and a drain coupled to said base of said second transistor.

16. The circuit according to claim 15 wherein said seventh means comprises a sixth transistor having a source coupled to said emitter of said third transistor, a gate coupled to receive a first enable signal, and a drain coupled to said base of said first transistor.

* * * * *